(12) United States Patent
Raberg et al.

(10) Patent No.: US 8,174,260 B2
(45) Date of Patent: May 8, 2012

(54) INTEGRATED CIRCUIT WITH MAGNETIC MATERIAL MAGNETICALLY COUPLED TO MAGNETO-RESISTIVE SENSING ELEMENT

(75) Inventors: Wolfgang Raberg, Sauerlach (DE); Juergen Zimmer, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 925 days.

(21) Appl. No.: 12/198,143

(22) Filed: Aug. 26, 2008

(65) Prior Publication Data

US 2010/0052672 A1   Mar. 4, 2010

(51) Int. Cl.
*G01R 33/02* (2006.01)

(52) U.S. Cl. .................... 324/252; 324/207.21

(58) Field of Classification Search .............. 324/207.21, 324/252
See application file for complete search history.

(56) References Cited

U.S. PATENT DOCUMENTS

| | | |
|---|---|---|
| 6,266,218 B1 | 7/2001 | Carey et al. |
| 6,633,462 B2 | 10/2003 | Adelerhof |
| 6,775,109 B2 | 8/2004 | Gambino et al. |
| 6,998,839 B2 | 2/2006 | Doescher |
| 7,705,586 B2 * | 4/2010 | van Zon et al. .......... 324/207.21 |
| 7,956,604 B2 * | 6/2011 | Ausserlechner .............. 324/252 |
| 2001/0038286 A1 | 11/2001 | Doescher |
| 2001/0053052 A1 | 12/2001 | Ihara et al. |
| 2006/0292705 A1 | 12/2006 | Hegde et al. |
| 2007/0068797 A1 | 3/2007 | Jayasekara |
| 2007/0146939 A1 | 6/2007 | Pinarbasi |
| 2008/0032423 A1 * | 2/2008 | Wang et al. .................. 436/536 |
| 2008/0174308 A1 | 7/2008 | Coillot et al. |

FOREIGN PATENT DOCUMENTS

| | | |
|---|---|---|
| DE | 4427495 A1 | 2/1996 |
| DE | 102005040539 A1 | 3/2007 |
| DE | 102005052688 A1 | 5/2007 |
| WO | 2007020154 A1 | 2/2007 |

* cited by examiner

*Primary Examiner* — Reena Aurora
(74) *Attorney, Agent, or Firm* — Dicke, Billig & Czaja, PLLC

(57) ABSTRACT

An integrated circuit including a first magneto-resistive sensing element, magnetic material and a spacer. The magnetic material is situated laterally to the first magneto-resistive sensing element. The spacer is situated between the first magneto-resistive sensing element and the magnetic material. The magnetic material is magnetically coupled to the first magneto-resistive sensing element.

22 Claims, 6 Drawing Sheets

INTEGRATED CIRCUIT WITH MAGNETIC MATERIAL MAGNETICALLY COUPLED TO MAGNETO-RESISTIVE SENSING ELEMENT

BACKGROUND

Magneto-resistive (XMR) sensors are employed in a wide range of technological applications including automotive, industrial and consumer applications. XMR sensors can be used in sensors, such as proximity sensors, motion sensors, position sensors, speed sensors and angular sensors. These applications need sensors that are accurate, where accuracy requirements continue to increase for sensors such as angular sensors. XMR sensor elements include elements, such as anisotropic magneto-resistive (AMR) sensor elements, giant magneto-resistive (GMR) sensor elements and tunneling magneto-resistive (TMR) sensor elements.

Typically, an XMR sensor element is arranged in a long meandering stripe of sensor material to obtain an electrical resistance that is suitable for signal processing. Manufacturers try to keep the XMR sensor area on an integrated circuit as small as possible to lower costs and improve performance. Often, the width of a XMR sensor stripe is minimized or reduced to realize a certain resistance in a given area. However, reducing the width of an XMR sensor stripe reduces the accuracy of the XMR sensor, including the angular accuracy of the XMR sensor.

SUMMARY

One embodiment described in the disclosure provides an integrated circuit including a first magneto-resistive sensing element, magnetic material and a spacer. The magnetic material is situated laterally to the first magneto-resistive sensing element. The spacer is situated between the first magneto-resistive sensing element and the magnetic material. The magnetic material is magnetically coupled to the first magneto-resistive sensing element.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
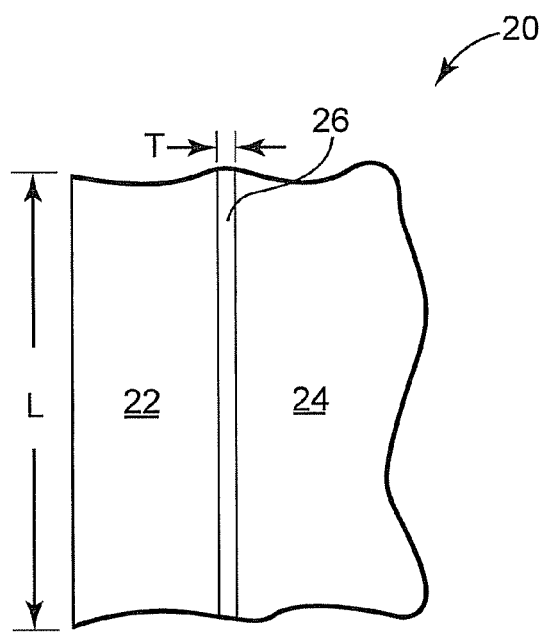
FIG. 1 is a diagram illustrating one embodiment of part of a magneto-resistive sensor on an integrated circuit.

FIG. 1 is a diagram illustrating one embodiment of part of a magneto-resistive sensor 20 on an integrated circuit. Magneto-resistive sensor 20 includes magneto-resistive sensing element 22, magnetic material 24 and a spacer 26. Magnetic material 24 is situated laterally to magneto-resistive sensing element 22 and spacer 26 is situated between magneto-resistive sensing element 22 and magnetic material 24. In one embodiment, magneto-resistive sensor 20 is an AMR sensor. In one embodiment, magneto-resistive sensor 20 is a GMR sensor. In one embodiment, magneto-resistive sensor 20 is a TMR sensor.

Magneto-resistive sensing element 22 includes a material stack that meanders in a long stripe on the integrated circuit. Spacer 26 electrically insulates magneto-resistive sensing element 22 from magnetic material 24 along the length L of magneto-resistive sensing element 22. Spacer 26 has a thickness T that is thin enough that magnetic material 24 is magnetically coupled to magneto-resistive sensing element 22. In one embodiment, spacer 26 is less than 1 micrometer thick T. In one embodiment, spacer 26 is less than 500 nanometers thick T.

In operation, magneto-resistive sensor 20 senses the direction of an external magnetic field. The magnetic material in magneto-resistive sensing element 22 and magnetic material 24 aligns with the external magnetic field and the resistance through magneto-resistive sensor 20 indicates the direction of the external magnetic field. Shape anisotropy tries to align magnetic material at the edges of magneto-resistive sensing element 22 and magnetic material 24 along length L, which prevents or distorts alignment in the direction of the external magnetic field along the edges. However, magnetic material 24 and magneto-resistive sensing element 22 are magnetically coupled, which reduces shape anisotropy in the magneto-resistive sensing element 22 and improves the accuracy, including angular accuracy, of magneto-resistive sensor 20.

In one embodiment, magneto-resistive sensor 20 includes a second active magneto-resistive sensing element that includes magnetic material 24. In one embodiment, magneto-resistive sensor 20 includes a non-active (dummy) magneto-resistive sensing element that includes magnetic material 24. In one embodiment, magneto-resistive sensor 20 includes a magneto-resistive film that includes magnetic material 24, where spacer 26 is a groove in the magneto-resistive film and magneto-resistive sensing element 22 is at least partially defined via the groove.

In one embodiment, magneto-resistive sensing element 22 meanders in a long stripe that includes sensing stripes. One of the sensing stripes includes magneto-resistive sensing element 22 and an adjacent one of the sensing stripes includes magnetic material 24. Spacer 26 is situated between the adjacent sensing stripes, which are magnetically coupled together to reduce shape anisotropy in magneto-resistive sensor 20 in an external magnetic field.

In one embodiment, spacer 26 is a non-conducting spacer layer and magnetic material 24 is a ferromagnetic layer. In one embodiment of a method of manufacturing a magneto-resistive sensor 20, a patterned magneto-resistive sensing element 22 is formed and a non-conducting spacer 26 is deposited over magneto-resistive sensing element 22 and the surrounding area. Magnetic material 24 is deposited over the non-conducting spacer 26 and removed from the top of magneto-resistive sensing element 22. Spacer 26 is, optionally, left on the top of magneto-resistive sensing element 22.

In one embodiment, spacer 26 is a non-conducting layer and magnetic material 24 is a ferromagnetic layer optimized to respond to the external magnetic field. In one embodiment, magnetic material 24 is a ferromagnetic layer optimized to respond to the external magnetic field and magneto-resistive sensing element 22 is optimized to provide an electrical signal output that indicates the direction of the external magnetic field.

Figure 2:
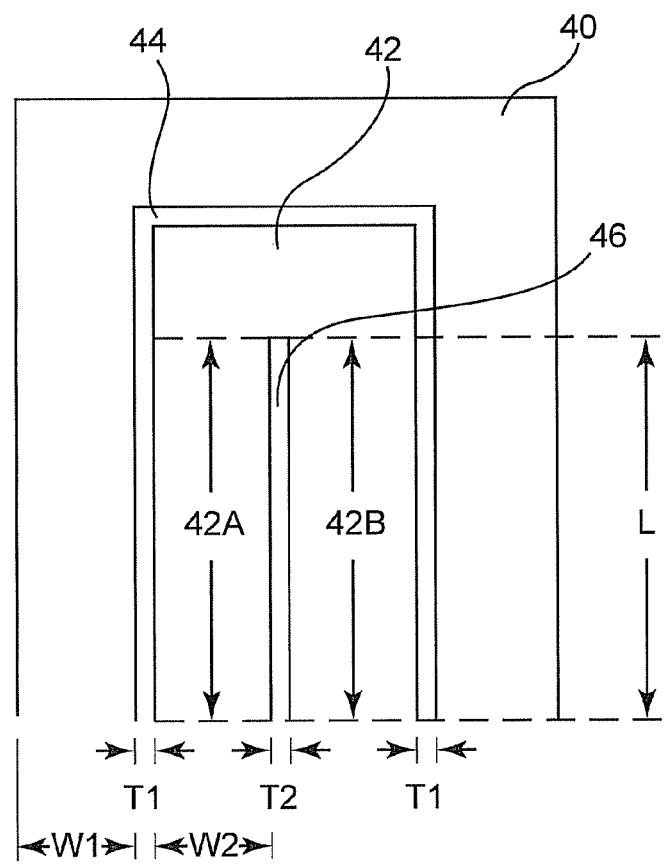
FIG. 2 is a diagram illustrating one embodiment of a first magneto-resistive sensing element and a second magneto-resistive sensing element.

FIG. 2 is a diagram illustrating one embodiment of a first magneto-resistive sensing element 40 and a second magneto-resistive sensing element 42 in a magneto-resistive sensor on an integrated circuit. Each of the first and second magneto-resistive sensing elements 40 and 42 includes a material stack including magnetic material that meanders in a stripe on the integrated circuit. In one embodiment, first magneto-resistive sensing element 40 and second magneto-resistive sensing element 42 are part of a magneto-resistive sensor such as magneto-resistive sensor 20.

First magneto-resistive sensing element 40 and second magneto-resistive sensing element 42 are spaced apart via a first spacer 44 having a thickness T1. Second magneto-resistive sensing element 42 includes sensing stripes 42A and 42B that have length L and are spaced apart via second spacer 46 that has a thickness T2. In one embodiment thickness T2 is substantially the same as thickness T1. In one embodiment thickness T2 is different than thickness T1.

First spacer 44 electrically insulates first magneto-resistive sensing element 40 from second magneto-resistive sensing element 42 and first spacer 44 has a thickness T1 that is thin enough that first magneto-resistive sensing element 40 is magnetically coupled to second magneto-resistive sensing element 42. In one embodiment, first spacer 44 is less than 1 micrometer thick. In one embodiment, first spacer 44 is less than 500 nanometers thick.

Second spacer 46 electrically insulates sensing stripes 42A and 42B of second magneto-resistive sensing element 42 and second spacer 46 has a thickness T2 that is thin enough that sensing stripes 42A and 42B are magnetically coupled. In one embodiment, second spacer 46 is less than 1 micrometer thick. In one embodiment, second spacer 46 is less than 500 nanometers thick.

In operation, first and second magneto-resistive sensing elements 40 and 42 are used to sense the direction of an external magnetic field. First magneto-resistive sensing element 40 and second magneto-resistive sensing element 42 substantially align with the external magnetic field, where shape anisotropy tries to align magnetic material at the edges of first and second magneto-resistive sensing elements 40 and 42 along their lengths. However, first and second magneto-resistive sensing elements 40 and 42 are magnetically coupled together and sensing stripes 42A and 42B are magnetically coupled together to provide a response to the external magnetic field that is similar to a sheet magnetic film response. This reduces shape anisotropy and improves the accuracy of the magneto-resistive sensor for a given width, such that the widths W1 and W2 of first and second magneto-resistive sensing elements 40 and 42 can be reduced to achieve the same or better accuracy.

The resistance through one or both of the first and second magneto-resistive sensing elements 40 and 42 indicates the direction of the external magnetic field. In one embodiment, first magneto-resistive sensing element 40 is an active magneto-resistive sensing element and second magneto-resistive sensing element 42 is an in-active (dummy) magneto-resistive sensing element. In one embodiment, first magneto-resistive sensing element 40 is an in-active magneto-resistive sensing element and second magneto-resistive sensing element 42 is an active magneto-resistive sensing element. In one embodiment, first magneto-resistive sensing element 40 and second magneto-resistive sensing element 42 are part of the same active magneto-resistive sensing element on the integrated circuit.

Optionally, another active or non-active magneto-resistive sensing element is situated around the structure of first magneto-resistive sensing element 40 and spaced apart from first magneto-resistive sensing element 40. This optional magneto-resistive sensing element is insulated from and magnetically coupled to first magneto-resistive sensing element 40 and reduces anisotropy.

Figure 3:
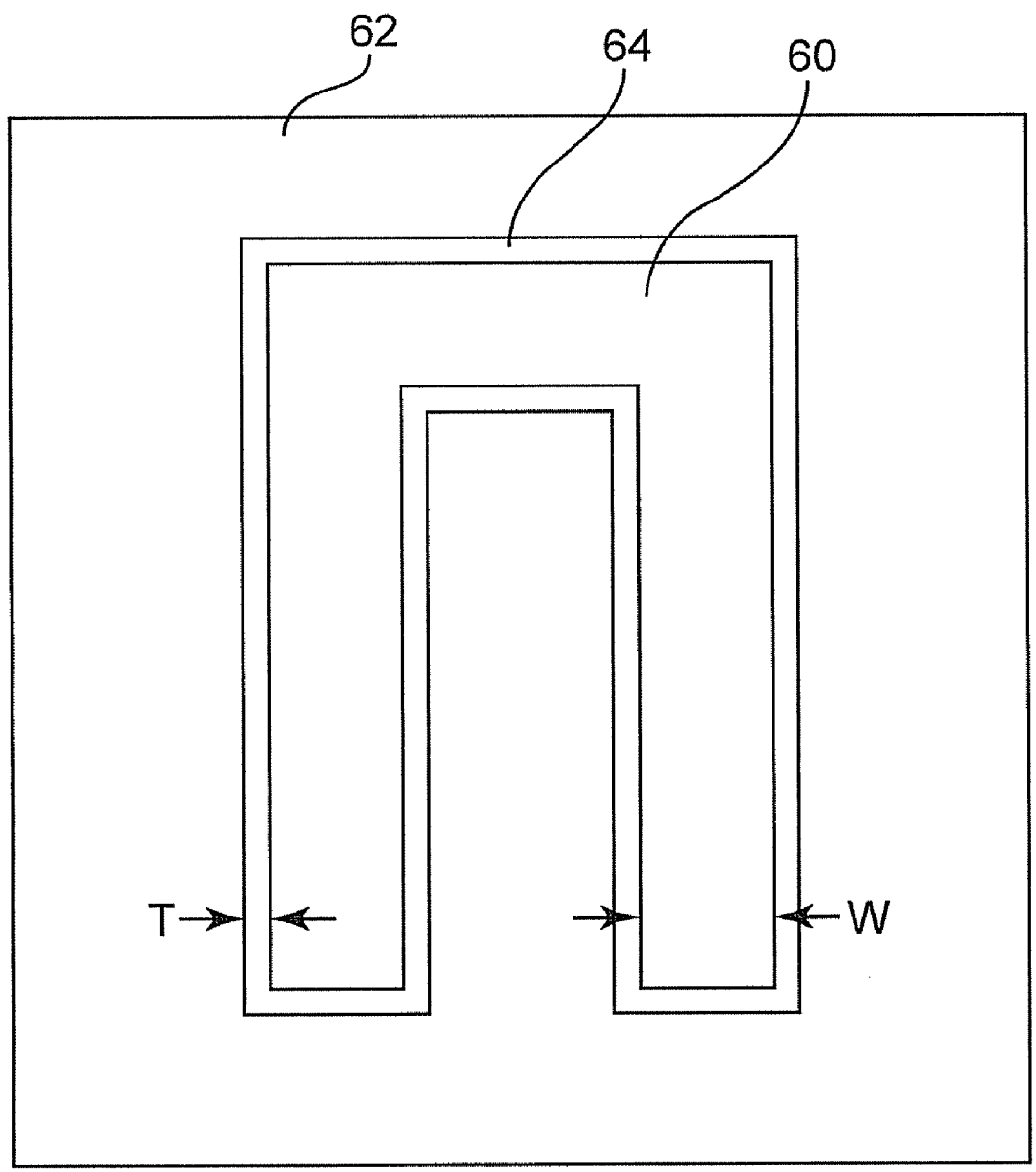
FIG. 3 is a diagram illustrating one embodiment of a magneto-resistive sensing element and a magneto-resistive film.

FIG. 3 is a diagram illustrating one embodiment of a magneto-resistive sensing element 60 and a magneto-resistive film 62 in a magneto-resistive sensor on an integrated circuit. Magneto-resistive sensing element 60 includes a material stack including magnetic material in a stripe on the integrated circuit. Magneto-resistive film 62 includes a material stack including magnetic material on the integrated circuit. In one embodiment, magneto-resistive sensing element 60 and magneto-resistive film 62 are part of a magneto-resistive sensor such as magneto-resistive sensor 20.

Magneto-resistive sensing element 60 and magneto-resistive film 62 are spaced apart via a spacer 64 having a thickness T. Spacer 64 electrically insulates magneto-resistive sensing element 60 from magneto-resistive film 62 and spacer 64 has a thickness T that is thin enough that magneto-resistive sensing element 60 is magnetically coupled to magneto-resistive film 62. In one embodiment, spacer 64 is less than 1 micrometer thick T. In one embodiment, spacer 64 is less than 500 nanometers thick T.

Spacer 64 is a groove in magneto-resistive film 62 that at least partially defines magneto-resistive sensing element 60. In one embodiment, spacer 64 is etched out of magneto-resistive film 62 via reactive ion etching to at least partially define magneto-resistive sensing element 60. In one embodiment, spacer 64 is milled out of magneto-resistive film 62 via ion milling to at least partially define magneto-resistive sensing element 60.

In operation, magneto-resistive sensing element 60 and magneto-resistive film 62 are used to sense the direction of an external magnetic field. Magneto-resistive sensing element 60 and magneto-resistive film 62 substantially align with the external magnetic field, where shape anisotropy tries to align magnetic material at the edges of magneto-resistive sensing element 60 along its length. However, magneto-resistive sensing element 60 and magneto-resistive film 62 are magnetically coupled together to provide a response to the external magnetic field that is similar to a sheet magnetic film response. This reduces shape anisotropy and improves the accuracy of the magneto-resistive sensor for a given width, such that the width W of magneto-resistive sensing element 60 can be reduced to achieve the same or better accuracy. The resistance through magneto-resistive sensing element 60 indicates the direction of the external magnetic field.

Figure 4:
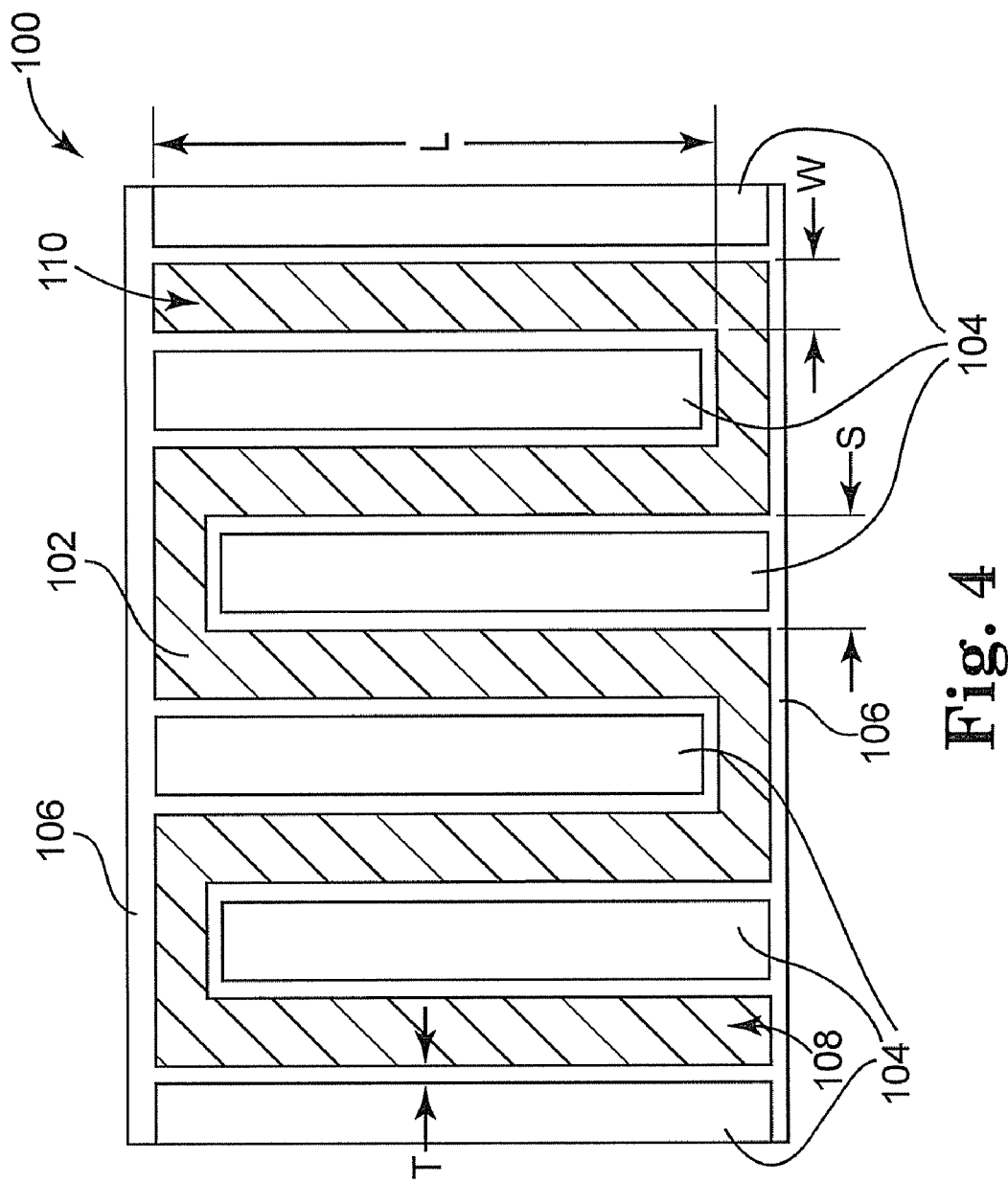
FIG. 4 is a diagram illustrating one embodiment of a magneto-resistive sensor on an integrated circuit.

FIG. 4 is a diagram illustrating one embodiment of a magneto-resistive sensor 100 on an integrated circuit. Magneto-resistive sensor 100 includes a magneto-resistive sensing element 102, magnetic material 104 and a spacer 106. Magneto-resistive sensing element 102 includes a material stack that meanders in a stripe on the integrated circuit. In one embodiment, magneto-resistive sensor 100 is an AMR sensor. In one embodiment, magneto-resistive sensor 100 is a GMR sensor. In one embodiment, magneto-resistive sensor 100 is a TMR sensor. In one embodiment, magneto-resistive sensor 100 is similar to magneto-resistive sensor 20.

Magneto-resistive sensing element 102 and magnetic material 104 are spaced apart via spacer 106. Magneto-resistive sensing element 102 includes a free layer of magnetic material that is free to substantially align with an external magnetic field. Electrical contact is made to magneto resistive sensing element 102 at each of the ends 108 and 110 and the resistance between ends 108 and 110 indicates the angle of the external magnetic field. In one embodiment, magneto-resistive sensing element 102 includes a free layer of nickel-iron (NiFe). In one embodiment, magneto-resistive sensing element 102 includes a free layer of cobalt-iron (CoFe). In one embodiment, magneto-resistive sensing element 102 includes a free layer that is a mixture of NiFe and CoFe. In one embodiment, magneto-resistive sensing element 102 includes a free layer of cobalt-iron-boron (CoFeB).

Spacer 106 is a non-conducting layer that electrically insulates magneto-resistive sensing element 102 from magnetic material 104. Spacer 106 has a thickness T that is thin enough that magneto-resistive sensing element 102 is magnetically coupled to magnetic material 104. In one embodiment, spacer 106 is less than 1 micrometer thick T. In one embodiment, spacer 106 is in the range of from 10 to 50 nanometers thick T. In one embodiment, spacer 106 is aluminum oxide (Alox). In one embodiment, spacer 106 is a silicon oxide (SiO2). In one embodiment, spacer 106 is silicon nitride (SiN).

Magnetic material 104 is a ferromagnetic layer that is magnetically coupled to magneto-resistive sensing element 102 and electrically insulated from magneto-resistive sensing element 102 via spacer 106. In one embodiment, magnetic material 104 is less than 10 nanometers thick. In one embodiment, magnetic material 104 is 5 nanometers thick. In one embodiment, magnetic material 104 is NiFe. In one embodiment, magnetic material 104 is CoFe. In one embodiment, magnetic material 104 is a combination of NiFe and CoFe. In one embodiment, magnetic material 104 is CoFeB.

In one embodiment, magneto-resistive sensing element 102 and magnetic material 104 are made to have different magnetic properties. Where, magnetic material 104 is provided to determine the magnetic response to the external magnetic field and magneto-resistive sensing element 102 is provided to transfer the magnetic response into an electrical signal or resistance via the magnetic coupling between magneto-resistive sensing element 102 and magnetic material 104.

In operation, magneto-resistive sensing element 102 and magnetic material 104 are used to sense the direction of an external magnetic field. Magneto-resistive sensing element 102 and magnetic material 104 substantially align with the external magnetic field, where shape anisotropy tries to align magnetic material at the edges of magneto-resistive sensing element 102 along its length L. However, magneto-resistive sensing element 102 and magnetic material 104 are magnetically coupled to provide a response to the external magnetic field that is similar to a sheet magnetic film response. This reduces shape anisotropy and improves the accuracy of magneto-resistive sensor 100 for a given width W, such that the width W of magneto-resistive sensing element 102 and stripe spacing S can be reduced to achieve the same or better accuracy. The resistance through magneto-resistive sensing element 102 between ends 108 and 110 indicates the direction of the external magnetic field.

FIGS. 5-9 are cross-section diagrams illustrating a method of manufacturing a magneto-resistive sensor, such as magneto-resistive sensor 100.

Figure 5:
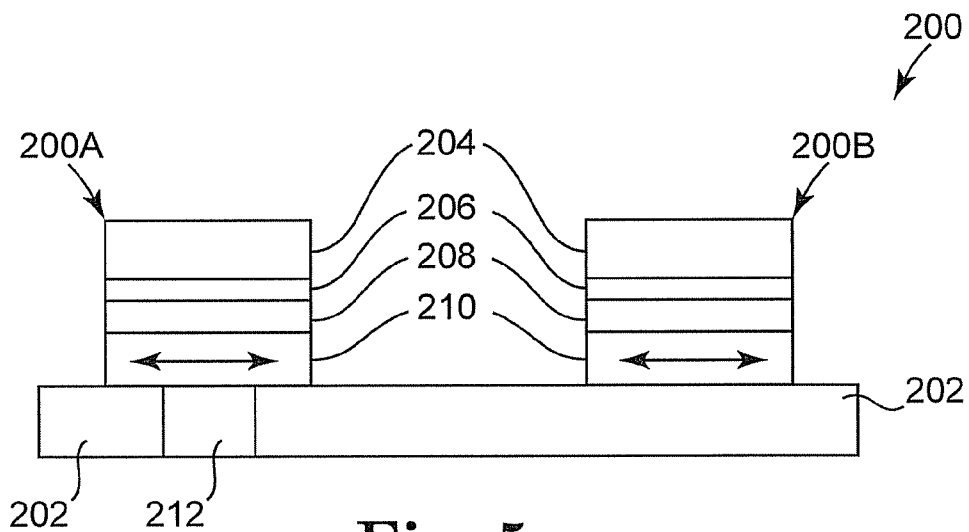
FIG. 5 is a diagram illustrating one embodiment of part of a magneto-resistive sensing element on a substrate.

FIG. 5 is a diagram illustrating one embodiment of part of a magneto-resistive sensing element 200 on a substrate 202. Magneto-resistive sensing element 200 is a meandering stripe of stack material including left stripe stack 200A and right stripe stack 200B. Magneto-resistive sensing element 200 is a GMR sensing element including a top-pinned GMR stack. The stack material is deposited on substrate 202 and patterned to form the meandering magneto-resistive sensing element 200. In one embodiment, substrate 202 includes a top interlayer dielectric, such as SiN or SiO2. In other embodiments, magneto-resistive sensing element 200 can be a different type of sensing element, such as an AMR sensing element or a TMR sensing element.

Each of the left and right stripe stacks 200A and 200B includes an anti-ferromagnetic layer 204, a fixed ferromagnetic layer 206, a stack spacer layer 208 and a sense layer (also referred to as a free layer) 210. Magneto-resistive sensing element 200 is electrically coupled to other circuits at one end via contact 212 and at another end via another contact (not shown).

Anti-ferromagnetic layer 204 pins fixed ferromagnetic layer 206 in a fixed direction. In one embodiment, anti-ferromagnetic layer 204 is platinum manganese. In one embodiment, anti-ferromagnetic layer 204 is iridium manganese. In one embodiment, fixed ferromagnetic layer 206 is CoFe. In one embodiment, fixed ferromagnetic layer 206 is CoFeB.

Stack spacer layer 208 magnetically decouples sense layer 210 from fixed ferromagnetic layer 206, such that sense layer 210 is free to align with an external magnetic field. The resistance through magnetic sensing element 200 indicates the direction of the external magnetic field. In one embodiment, stack spacer layer 208 is copper. In one embodiment, sense layer 210 is NiFe. In one embodiment, sense layer 210 is CoFe. In one embodiment, sense layer 210 is a mixture of NiFe and CoFe. In one embodiment, sense layer 210 is CoFeB.

Figure 6:
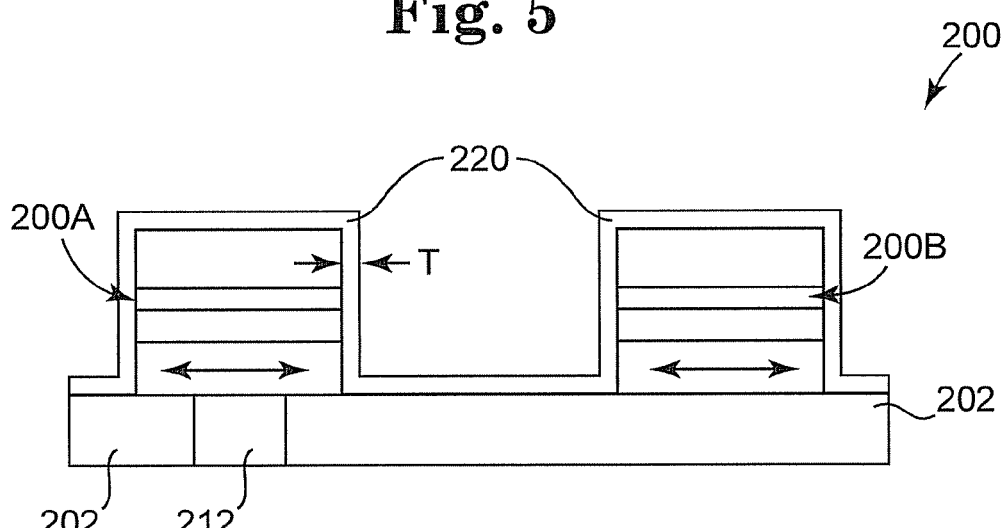
FIG. 6 is a diagram illustrating a spacer on the substrate and on the patterned magneto-resistive sensing element.

FIG. 6 is a diagram illustrating a spacer 220 on substrate 202 and on the patterned magneto-resistive sensing element 200 including left and right stripe stacks 200A and 200B. Spacer 220 is deposited over substrate 202 and the patterned magneto-resistive sensing element 200 including left and right stripe stacks 200A and 200B. In one embodiment, spacer 220 is less than 1 micrometer thick T. In one embodiment, spacer 220 is from 10 to 50 nanometers thick T. In one embodiment, spacer 220 is aluminum oxide (Alox). In one embodiment, spacer 220 is a SiO2. In one embodiment, spacer 220 is SiN.

Figure 7:
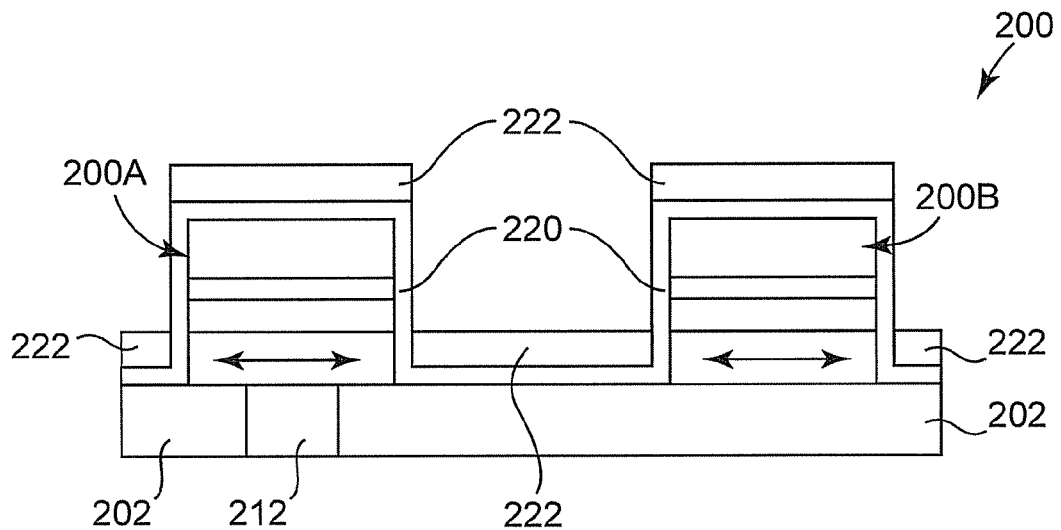
FIG. 7 is a diagram illustrating magnetic material on the spacer.

FIG. 7 is a diagram illustrating magnetic material 222 on spacer 220. Magnetic material 222 is deposited on spacer 220 in a deposition where magnetic material 222 is not deposited over side walls of left and right stripe stacks 200A and 200B. Also, optionally, seed and/or capping layers, such as tantalum (Ta) or tantalum nitride (TaN), are deposited.

Magnetic material 222 is a ferromagnetic layer that is magnetically coupled to sense layer 210 of magneto-resistive sensing element 200 and electrically insulated from magneto-resistive sensing element 200 via spacer 220. In one embodiment, magnetic material 222 is less than 10 nanometers thick. In one embodiment, magnetic material 222 is substantially 5 nanometers thick. In one embodiment, magnetic material 222 is NiFe. In one embodiment, magnetic material 222 is CoFe. In one embodiment, magnetic material 222 is a combination of NiFe and CoFe. In one embodiment, magnetic material 222 is CoFeB.

Figure 8:
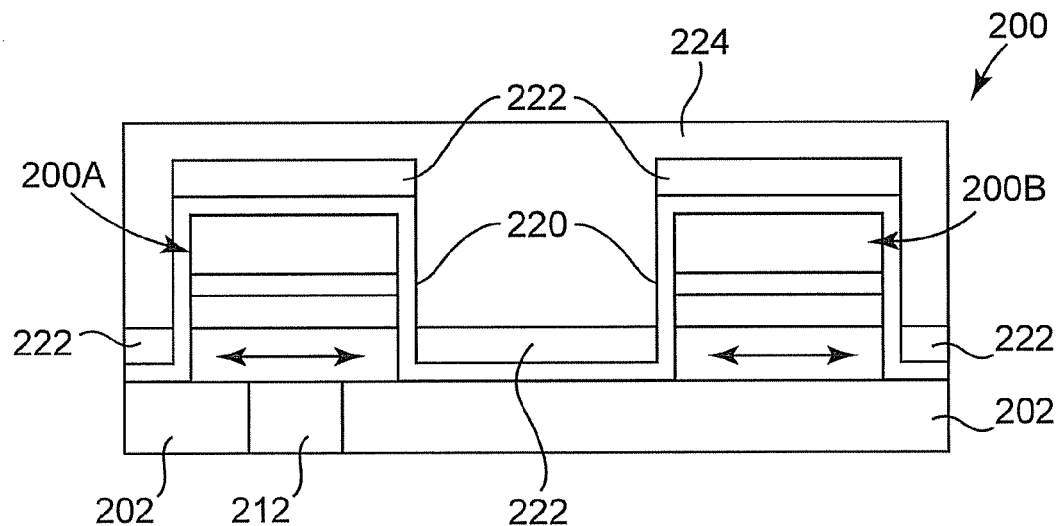
FIG. 8 is a diagram illustrating a dielectric material filled around a magneto-resistive sensor.

FIG. 8 is a diagram illustrating a dielectric material 224 filled around magneto-resistive sensor 200. In one embodiment, dielectric material 224 is SiO2. In one embodiment, dielectric material 224 is SiN.

Figure 9:
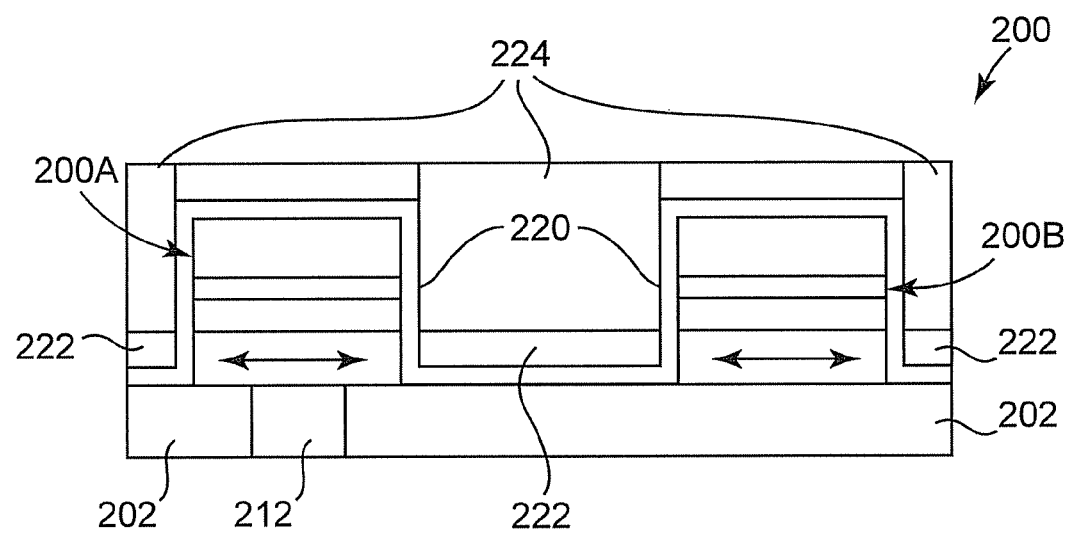
FIG. 9 is a diagram illustrating a magneto-resistive sensor after the dielectric material and magnetic material are removed.

FIG. 9 is a diagram illustrating magneto-resistive sensor 200 after dielectric material 224 and magnetic material 222 are removed from the top of left and right stripe stacks 200A and 200B. In one embodiment, dielectric material 224 and magnetic material 222 are removed via chemical mechanical polishing (CMP), stopping on spacer 220. In one embodiment, dielectric material 224 and some of magnetic material 222 from the top of left and right stripe stacks 200A and 200B are removed via CMP, where the CMP stops in magnetic material 222 and the remaining magnetic material 222 is removed via a wet etch and/or oxidized.

Figure 10:
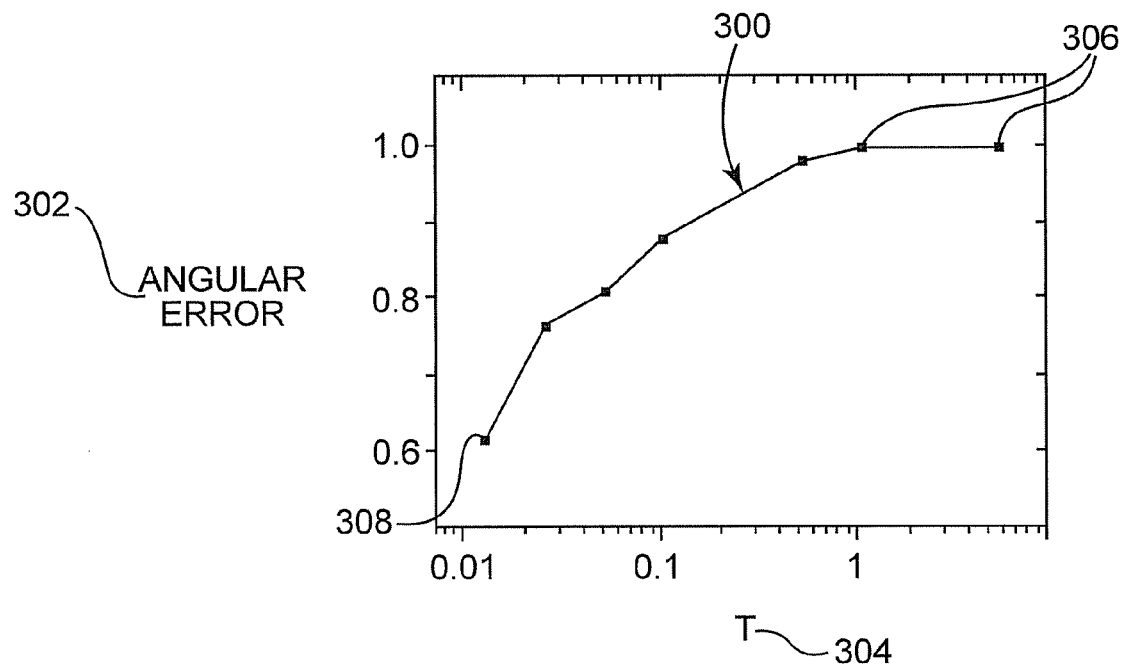
FIG. 10 is a diagram illustrating improvement in the angular error of a magneto-resistive sensor with reduced spacer thickness.

FIG. 10 is a diagram illustrating, at 300, the improvement in the angular error of a magneto-resistive sensor with reduced spacer thickness. Angular error at 302 on the vertical axis is graphed versus thickness T of the spacer at 304 on the horizontal axis. The spacer is the spacer between magnetically coupled materials, such as spacer 26 (shown in FIG. 1), spacers 44 and 46 (shown in FIG. 2), spacer 64 (shown in FIG. 3), spacer 106 (shown in FIG. 4) and spacer 220 (shown in FIGS. 6-9).

At 306, the angular error is about 1 for a thickness of 1 or more. At 308, angular error decreases to about 0.6 for a thickness of a little more than 0.01. In one embodiment, angular error is measured in degrees and thickness is measured in micrometers, such that angular error is about 1 degree for a thickness of 1 or more micrometers and angular error decreases to about 0.6 degrees for a thickness of a little more than 0.01 micrometers.

Figure 11:
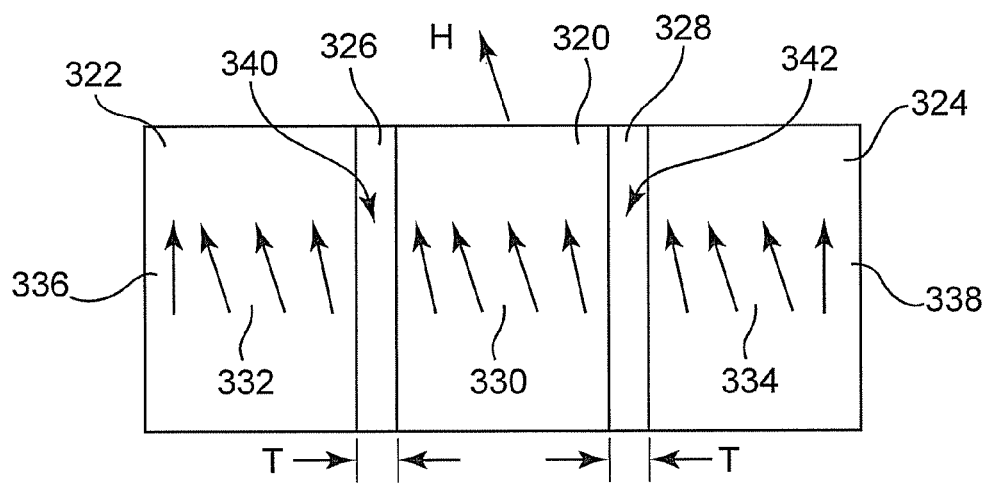
FIG. 11 is a diagram illustrating the magnetization of domains in a magneto-resistive sensing element that is magnetically coupled to magnetic material in an external magnetic field.

FIG. 11 is a diagram illustrating the magnetization of domains in a magneto-resistive sensing element 320 that is magnetically coupled to magnetic material 322 and 324 in an external magnetic field H. Magneto-resistive sensing element 320 is spaced from magnetic material 322 and 324 via spacers 326 and 328. Each of the spacers 326 and 328 has a thickness T that is thin enough for magneto-resistive sensing element 320 to be magnetically coupled to magnetic material 322 and 324. Spacers 326 and 328 are similar to spacers, such as spacer 26 (shown in FIG. 1), spacers 44 and 46 (shown in FIG. 2), spacer 64 (shown in FIG. 3), spacer 106 (shown in FIG. 4) and spacer 220 (shown in FIGS. 6-9).

The external magnetic field H points to the left of vertical and the domains at 330 in the middle of magneto-resistive sensing element 320 along with the domains at 332 and 334 in the middle of magnetic material 322 and 324 substantially align in the direction of the magnetic field H. However, at 336 and 338, the domains at the edges of magnetic material 322 and 324 align in the vertical direction, along the length of magnetic material 322 and 324, due at least in part to shape anisotropy. At 340 and 342, the domains at the edges of magneto-resistive sensing element 320 and magnetic material 322 and 324 are magnetically coupled to at least partially align in the direction of the magnetic field H. Magnetic coupling of magneto-resistive sensing element 320 and magnetic material 322 and 324 reduces shape anisotropy and improves accuracy, including angular accuracy, of the magneto-resistive sensor that includes magneto-resistive sensing element 320.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
a first magneto-resistive sensing element;
magnetic material situated laterally to the first magneto-resistive sensing element and configured to align with an external magnetic field; and
a spacer situated between the first magneto-resistive sensing element and the magnetic material, wherein the spacer has a thickness configured to facilitate magnetic coupling between the magnetic material and the first magneto-resistive sensing element and reduce shape anisotropy in the first magneto-resistive sensing element in the external magnetic field.

2. The integrated circuit of claim 1, comprising:
a second magneto-resistive sensing element that includes the magnetic material.

3. The integrated circuit of claim 1, comprising:
a non-active magneto-resistive sensing element that includes the magnetic material.

4. The integrated circuit of claim 1, comprising:
a magneto-resistive film that includes the magnetic material.

5. The integrated circuit of claim 4, wherein the spacer is a groove in the magneto-resistive film and the first magneto-resistive sensing element is at least partially defined via the groove.

6. The integrated circuit of claim 1, wherein the spacer is a non-conducting layer deposited over the first magneto-resistive sensing element.

7. The integrated circuit of claim 6, wherein the magnetic material is a ferromagnetic layer deposited over the non-conducting layer.

8. The integrated circuit of claim 1, wherein the magnetic material is a ferromagnetic layer provided for response to the external magnetic field and the first magneto-resistive sensing element is provided for transferring the response to the external magnetic field into an electrical signal.

9. The integrated circuit of claim 1, wherein the spacer has a width that is less than 1 micrometer.

10. The integrated circuit of claim 1, wherein the first magneto-resistive sensing element is one of a TMR sensor, a GMR sensor and an AMR sensor.

11. An integrated circuit, comprising:
a magneto-resistive sensing element including sensing stripes; and
a spacer situated between adjacent sensing stripes, wherein the adjacent sensing stripes are magnetically coupled directly to each other and magnetization of domains in one of the adjacent sensing stripes influences magnetization of domains in another one of the adjacent sensing stripes.

12. The integrated circuit of claim 11, wherein the adjacent sensing stripes reduce shape anisotropy in the magneto-resistive sensing element in an external magnetic field.

13. The integrated circuit of claim 11, wherein the spacer has a width that is less than 1 micrometer.

14. The integrated circuit of claim 11, wherein the magneto-resistive sensing element is one of a TMR sensor, a GMR sensor and an AMR sensor.

15. The integrated circuit of claim 11, comprising:
a non-active magneto-resistive sensing element situated laterally to the magneto-resistive sensing element, wherein the spacer is situated between the non-active magneto-resistive sensing element and the magneto-resistive sensing element.

16. A method of sensing a magnetic field, comprising:
sensing a magnetic field via a first magneto-resistive sensing element;
sensing the magnetic field via magnetic material that is magnetically coupled to the first magneto-resistive sensing element; and
reducing shape anisotropy in the first magneto-resistive sensing element via magnetic coupling of the first magneto-resistive sensing element and the magnetic material.

17. The method of claim 16, wherein sensing the magnetic field via magnetic material comprises:
sensing the magnetic field via a second magneto-resistive sensing element that is magnetically coupled to the first magneto-resistive sensing element.

18. The method of claim 16, wherein sensing the magnetic field via magnetic material comprises:
sensing the magnetic field via a non-active magneto-resistive sensing element that is magnetically coupled to the first magneto-resistive sensing element.

19. The method of claim 16, wherein sensing the magnetic field via magnetic material comprises:
sensing the magnetic field via a magneto-resistive film that is magnetically coupled to the first magneto-resistive sensing element.

20. The method of claim 16, wherein sensing the magnetic field via magnetic material comprises:
sensing the magnetic field via a ferromagnetic material on a non-conductive layer that insulates the ferromagnetic material from the first magneto-resistive sensing element.

21. A method of manufacturing a magneto-resistive sensor comprising:
forming a patterned magneto-resistive element;
depositing a non-conducting spacer layer over the patterned magneto-resistive element; and
depositing a ferromagnetic layer over the non-conducting spacer layer.

22. The method of claim 21, comprising:
removing the ferromagnetic layer from the top of the patterned magneto-resistive element.

* * * * *